United States Patent
Bauer et al.

(10) Patent No.: US 9,914,265 B2
(45) Date of Patent: Mar. 13, 2018

(54) METHOD FOR PRODUCING A HOMOGENEOUS LIGHT DISTRIBUTION

(71) Applicant: HERAEUS KULZER GMBH, Hanau (DE)

(72) Inventors: Christian Bauer, Westerngrund (DE); Marco Spatz, Sailauf (DE)

(73) Assignee: KULZER GMBH, Hanau (DE)

(*) Notice: Subject to any disclaimer, the term of this patent is extended or adjusted under 35 U.S.C. 154(b) by 228 days.

(21) Appl. No.: 14/654,184

(22) PCT Filed: Dec. 17, 2013

(86) PCT No.: PCT/EP2013/076902
§ 371 (c)(1),
(2) Date: Jun. 19, 2015

(87) PCT Pub. No.: WO2014/095864
PCT Pub. Date: Jun. 26, 2014

(65) Prior Publication Data
US 2015/0328834 A1    Nov. 19, 2015

(30) Foreign Application Priority Data
Dec. 20, 2012   (DE) .................. 10 2012 224 005

(51) Int. Cl.
*G02B 26/02*   (2006.01)
*B29C 67/00*   (2017.01)
(Continued)

(52) U.S. Cl.
CPC ........ *B29C 67/0066* (2013.01); *B29C 64/135* (2017.08); *B29C 64/20* (2017.08);
(Continued)

(58) Field of Classification Search
CPC .............. B29C 67/0066; B29C 67/007; B29C 67/0088; B29C 64/129; B29C 64/135;
(Continued)

(56) References Cited

U.S. PATENT DOCUMENTS

| 5,620,814 A | 4/1997 | Kley |
| RE43,955 E | 2/2013 | Shkolnik et al. |

(Continued)

FOREIGN PATENT DOCUMENTS

| EP | 1 880 830 A1 | 1/2008 |
| EP | 1 894 705 A2 | 3/2008 |
| EP | 1 982 824 A2 | 10/2008 |

OTHER PUBLICATIONS

International Search Report dated Apr. 3, 2014, dated Apr. 15, 2014 and English Translation of International Search Report dated Apr. 15, 2014.

*Primary Examiner* — Leo B Tentoni
(74) *Attorney, Agent, or Firm* — Norris McLaughlin & Marcus, P.A.

(57) ABSTRACT

The invention relates to a method for producing a homogenized distribution of light quantity with a spatial light modulator that comprises a multitude of controllable and tiltable micro-mirrors that are arranged in rows and columns, in which the light of a spatially emitting light source is projected by means of an optical system and an illuminated field of the projected light source is guided over a projection surface, whereby, towards the middle of the illuminated field, an increasing number of pixels is not being illuminated such that the time integral attains a homogenization of the light intensity of all pixels that are illuminated on the projection surface. The invention also relates to a rapid prototyping method, in which a liquid light-curing plastic material is illuminated by means of a method of this type, preferably is illuminated by UV light, whereby the illumi- (Continued)

nated field is projected onto the surface of the plastic material and the plastic material is cured through the illumination of the illuminated field.

13 Claims, 4 Drawing Sheets (51) Int. Cl.
    *G02B 26/08*     (2006.01)
    *B29C 64/386*     (2017.01)
    *B29C 64/393*     (2017.01)
    *G03F 7/20*     (2006.01)
    *B29C 64/135*     (2017.01)
    *B29C 64/20*     (2017.01)
    *B33Y 10/00*     (2015.01)
    *B29C 64/129*     (2017.01)

(52) U.S. Cl.
    CPC .......... *B29C 64/386* (2017.08); *B29C 64/393* (2017.08); *G02B 26/0816* (2013.01); *G03F 7/70291* (2013.01); *G03F 7/70416* (2013.01); *B29C 64/129* (2017.08); *B33Y 10/00* (2014.12); *G02B 26/0833* (2013.01)

(58) Field of Classification Search
    CPC ..... B29C 64/386; B29C 64/393; G02B 26/02; G02B 26/0833
    USPC ........................................ 264/401; 359/225.1
    See application file for complete search history.

(56) References Cited

U.S. PATENT DOCUMENTS

| | | |
|---|---|---|
| 2001/0035944 A1 | 11/2001 | Sunagawa |
| 2002/0008091 A1 | 1/2002 | Brandinger et al. |
| 2005/0248062 A1* | 11/2005 | Shkolnik ............... B29C 67/007 264/401 |
| 2006/0119743 A1 | 6/2006 | Lin |
| 2007/0284547 A1 | 12/2007 | Sejersen et al. |
| 2009/0209674 A1* | 8/2009 | Ito ............................ C08F 2/50 522/15 |
| 2010/0249979 A1 | 9/2010 | John et al. |

* cited by examiner

METHOD FOR PRODUCING A HOMOGENEOUS LIGHT DISTRIBUTION

This application is a 371 of International Patent Application No. PCT/EP2013/076902, filed Dec. 17, 2013, which claims foreign priority benefit under 35 U.S.C. § 119 of the German Application No. 10 2012 224 005.5, filed Dec. 20, 1012, the disclosures of which patent applications are incorporated herein by reference.

The invention relates to a method for producing a homogeneous distribution of light quantity with a spatial light modulator and to a rapid prototyping method using a method of this type.

Rapid prototyping methods involve the use of ultraviolet (UV) lasers and, increasingly, of UV-LED data projectors. Methods for this purpose are known, for example, from EP 1 880 830 A1 and EP 1 894 705 A2. In this context, the UV light is projected onto a light-curing plastic material. In this context, the projection involves the use of an optical system and a spatial light modulator. Due to the optical system, the distribution of light and/or the intensity distribution is inhomogeneous. The peripheral regions of the illuminated field typically show lower intensity than the regions in the centre of the illuminated field. Due to this effect, also called barrel image, the light-curing plastic material does not receive the same intensity in all places, which causes it to cure differently and therefore not homogeneously.

EP 1 982 824 A2 proposes to homogenise the intensity distribution by reducing the brighter pixels of the UV data projector to the intensity level of the pixels on the periphery by means of a grey distribution.

This is disadvantageous in that the grey distribution can be attained only through accurate control of the intensity. It is therefore also an object of the invention to provide a simpler method that can be used to attain a similar effect.

Accordingly, it is the object of the invention to overcome the disadvantages of the prior art. Specifically, a simpler method is to be provided that attains a satisfactory homogenisation of the light intensity of the illuminated field. The method shall be implementable as inexpensively as possible.

The objects of the invention are met by a method for producing a homogenised distribution of light quantity with a spatial light modulator that comprises a multitude of controllable and tiltable micro-mirrors that are arranged in rows and columns, in which the light of a spatially emitting light source is projected by means of an optical system and an illuminated field of the projected light source is guided over a projection surface with the spatial light modulator, whereby, towards the middle of the illuminated field, an increasing number of pixels is not being illuminated such that the time integral attains a homogenisation of the light intensity of all pixels that are illuminated on the projection surface.

In the scope of the present invention, pixels shall be understood to mean a smallest light source that can be controlled, e.g. addressed or triggered and from which the image of the data projector is composed.

The DLP® chips of Texas Instruments, for example, which are particularly well-suited, can be used as spatial light modulators.

The invention can provide a data projector, preferably an LED data projector, particularly preferably a UV-LED data projector, to be used as spatially emitting light source. Alternatively, a laser system can be used.

Both the data projector and the laser system preferably emit light of a wavelength selected from 180 to 600 nm, more preferably from 230 to 450 nm. In general, all polychromatic light sources can be used as data projector, whereby monochromatic light sources or essentially monochromatic light sources are particularly preferred though. The use of monochromatic light sources allows the light intensity and/or the radiation intensity to be made more uniform and thus a more homogeneous polymerisation to be attained. LED-UV data projectors with a wavelength of about 385 nm or laser systems with a laser with a wavelength of approx. 285 nm are particularly preferred. Data projectors with a resolution of larger than or equal to 1024×800, preferably larger than or equal to 1920×1080 pixels, in particular high-resolution of up to 100,000 or more pixels are preferred. It is particularly preferred to use spatially emitting light sources with coherent rays of light. Spatial coherence is also attained through a very small distance between the light source 1 and/or assembly 0 and the light area 5.

A small distance between the spatial light source, arrangement and/or assembly and the illuminated field shall be defined as 3 mm to 500 mm, in particular 3 mm to 250 mm, particularly preferably 3 mm to 150 mm, preferably 3 mm to 50 mm, alternatively the distance can just as well be 1 mm to 50 mm. According to the invention, the spatially emitting light source, the spatial light modulator, and the optical system, in particular a lens system, form an arrangement. Moreover, the spatially emitting light source, the spatial light modulator, and the optical system, in particular a lens system, are provided as an arrangement in an assembly.

In this context, the invention can provide a mask stored for Controlling the data projector, in particular a programmable mask, that defines the non-illuminated pixels in that certain light points of the data projector remain switched off at all times. A mask according to the invention corresponds to a motif of the switched-off light points of the light source, whereby the motif shows up in the illuminated field as non-illuminated pixels, in particular as a static motif of non-illuminated pixels.

Using the stored mask, it becomes very easy to reduce the light intensity in certain areas of the illuminated field. Using said mask, a homogenisation of the illuminated field, in particular a homogenisation of the light intensity of the illuminated field, particularly preferably a homogenisation in the time integral of the light intensity of the illuminated field, can be attained.

As an alternative to the use of a stored mask, the invention can just as well provide the non-illuminated pixels to be defined by a blackening of the micro-mirrors or through a spatial light modulator with voids in the micro-mirror configuration or through deflection of the light points by the micro-mirrors.

Omitting individual micro-mirrors can reduce the costs of the spatial light modulator and/or the requisite number of connections. If blackening is used, commercially available fully-configured spatial light modulators can be used.

A refinement of the method according to the invention can just as well provide the number of non-illuminated pixels to increase towards the middle according to a function, preferably linearly or according to a parabola, particularly preferably according to a function that takes into account the interferences that are present, preferably according to a function that improves the coherence of the illuminated field, preferably of the motif to be illuminated and/or printed.

As a result, the deviations in the intensity of the illuminated field, which typically occur due to the optical system, can be compensated particularly well. A function as specified compensates particularly well for the increase in intensity in the middle of the illuminated field.

In this context, the invention can provide the function to be determined, preferably calculated, depending on the inhomogeneity of the illuminated field caused by the optical system, in particular a lens system.

Preferably, the function is determined, preferably calculated, depending on the inhomogeneity of the illuminated field caused by the spatial light source, the arrangement comprising the spatial light source, the spatial light modulator and/or the optical system. Alternatively, the function is calculated depending on the inhomogeneity caused by the assembly comprising the light source.

The function according to which the number of non-illuminated pixels increases towards the middle of the illuminated field is determined as function of a reference 1, which indicates the original light intensity of the light source in the illuminated field on the projection surface (plane), and correlates it to reference 2, which indicates the homogeneous, spatial light intensity (energy density in the plane, averaged over x pixels) of the projection surface, in particular over 12×13 to 1920×1080 pixels. The projection surface can just as well comprise a higher resolution of pixels.

This measure also serves to provide for accurate compensation of the design-related errors in the intensity distribution and to thus generate an illuminated field that is as homogeneous as possible.

According to a particularly preferred embodiment of the method according to the invention, the invention can just as well provide the intensity distribution of the illuminated field to be measured or calculated at maximal illumination by the light source and the spatial light modulator, and the number of non-illuminated pixels in each row and/or column to be calculated therefrom.

This provides a particularly well-suited method that allows even specific intensity deviations of certain light sources, such as types of data projectors or individual data projectors, to be compensated by simple means.

According to a preferred embodiment, the invention can provide the spatially emitting light source, preferably the arrangement comprising the spatially emitting light source and/or the assembly comprising a spatially emitting light source to be guided over the projection surface in order to guide the illuminated field of the projected light source over the projection surface, whereby the illuminated field can be guided back-and-forth over the projection surface. This can take place in continuous or discontinuous manner.

As a result, a method that is particularly easy to implement is provided to implement the method in rapid prototyping. Said method is less error-prone than other methods, in particular those, in which only the illuminated field is guided over the projection surface.

A refinement of the method according to the invention proposes to periodically guide the illuminated field over the projection surface. Periodic sweeping over the projection surface attains a more uniform intensity along the direction of motion of the illuminated field.

The illuminated single images of the motif are obtained by a superimposition a) of the extracted single images of the motif, i.e. derived from the motif to be printed shown as single motifs in the scrolling process and/or guidance of the arrangement comprising the light source over the projection surface with b) the motif of the switched-off light points or the motif of the mask. The light intensity of the illuminated single images of the motif is homogenised as compared to illumination without spatial light modulator or mask.

According to a particularly preferred embodiment variant, the method involves generating single images of the motif that are illuminated in the illuminated field through a superimposition a) of extracted single images of the motif and b) the motif of the switched-off light points. The extracted single images of the motif correspond to the motif to be printed that has been decomposed into single images of the motif for the scrolling process (FIG. 3b).

The motif of the switched-off light points (FIG. 3c) shows the non-illuminated pixels, the static motif of non-illuminated pixels. The illuminated single images of the motif (FIG. 3d) are obtained through a superimposition of the corresponding single images of the motif (extracted single images of the motif, FIG. 3b) and the static motif of the switched-off light points, shown as static motif with non-illuminated pixels.

The motif to be printed is obtained by guiding the illuminated field with the illuminated single images of the motif over the projection surface.

The invention can just as well provide for the surface of a liquid light-curing plastic material to be used as projection surface. In particular, a light-curing dental material is used as light-curing plastic material. According to the invention, the initiator system of the light-curing plastic material and the wavelength of the light source are matched optimally to each other.

Using a liquid light-curing plastic material as projection surface, the method is well-suited for producing three-dimensional form bodies (as so-called rapid prototyping method).

The underlying objects of the invention are also met by a rapid prototyping method, in which a liquid light-curing plastic material is illuminated by means of a method of this type, preferably it is illuminated by UV light, whereby the illuminated field is projected onto the surface of the plastic material and the plastic material is cured through the illumination of the illuminated field.

The method according to the invention for homogenising the light intensity of the illuminated field has a particular impact on rapid prototyping methods, since the plastic bodies thus made can be built-up homogeneously.

The invention is based on the surprising finding that the use of dead and/or permanently black pixels, i.e. non-luminous pixels, allows a homogenisation of the UV light intensity to be attained without having to adjust grey values with the spatial light source for this purpose. A previously defined mask, which is stored in a data projector, preferably a UV data projector, can be used in this context. The number of pixels defined to be black in the rows and/or columns, i.e. non-luminous pixels, increases towards the middle of the illuminated field in order to compensate for the optical system-related attenuation in intensity of the illuminated field towards the periphery. This is necessary since the middle rows (and/or columns) are illuminated more brightly for constructive reasons (due to the optical system).

Methods according to the invention attain the following effect. The motion of the data projector and/or of the radiation originating from the data projector causes the entire row of the illuminated field to be controlled upon an illumination. As a result, a maximal light quantity (amount of UV light) is generated during the sweep. In an illuminated field consisting of, for example, 1920×1080 pixels, the maximal light quantity of 1080 pixels would be generated. If fewer pixels are controlled, e.g. triggered, both the power and/or the time integral of the light intensity is/are reduced. According to the invention, the uneven illumination by the optical system is compensated by this means.

Exemplary embodiments of the invention shall be illustrated in the following on the basis of two schematic figures, though without limiting the scope of the invention. In the figures.

Figure 1:
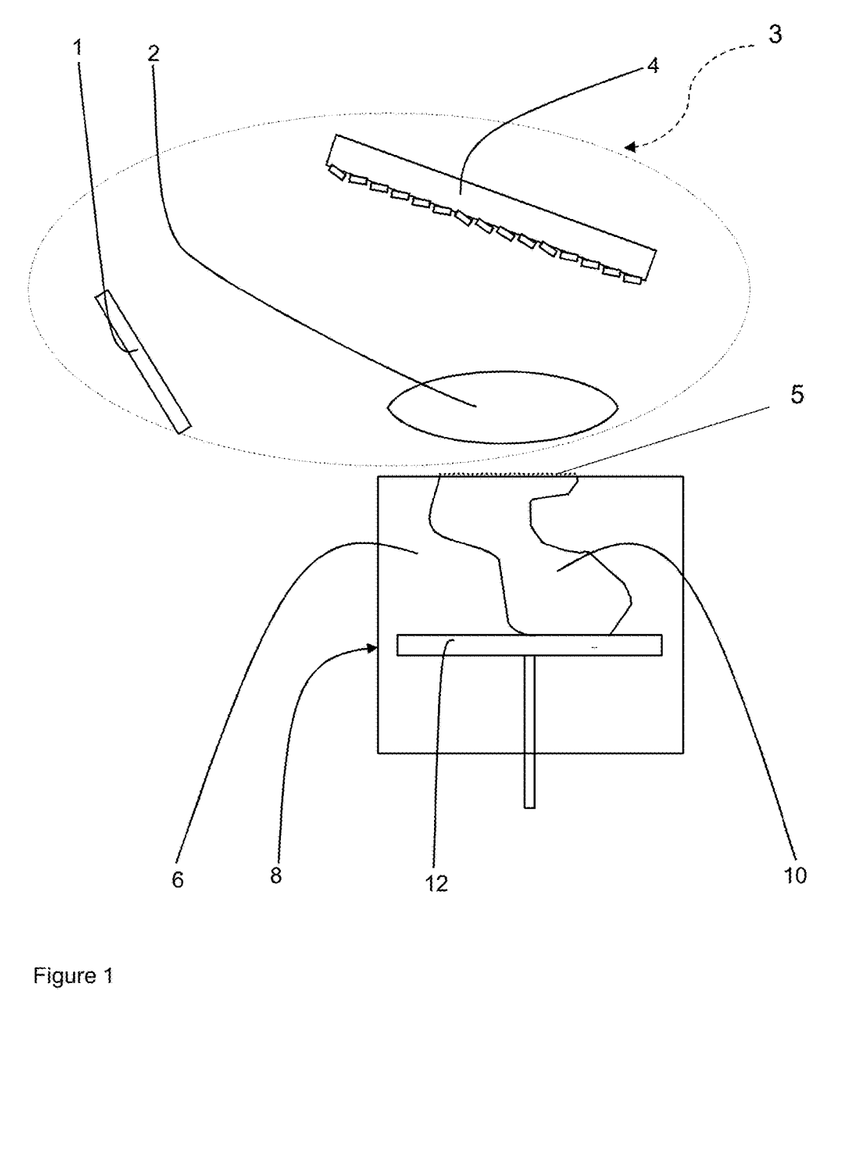
FIG. 1: shows a a cross-sectional view of a schematic set-up for implementation of a method according to the invention.

FIG. 1 shows a schematic cross-sectional view of a set-up for implementing a method according to the invention. A UV-LED data projector 1 emitting ultraviolet light (UV light) is made to emit at a spatial light modulator 4. The UV-LED data projector 1 has a resolution of 1920×1080 pixels that emit as a rectangular area on the surface of a chip of the UV-LED data projector 1. The spatial light modulator 4 comprises a multitude of micro-mirrors that can be controlled and by means of which the light from the UV-LED data projector 1 is reflected and projected onto the surface of a liquid light-curing plastic material 6 by means of a lens system 2. The micro-mirrors are shown in FIG. 1 as small rectangles, differing in orientation, on a surface of the spatial light modulator 4. The liquid plastic material 6 is arranged in a receptacle 8 that is open upwards toward the spatial light modulator 4 and/or the lens system 2.

Shown schematically as a simple lens in FIG. 1, the lens system 2 projects the area of the pixels of the UV-LED projector 1 onto the surface of the light-curing plastic material 6. Using a suitable motor (not shown), the UV-LED data projector 1 is moved across the receptacle 8 and thus the illuminated field is swept over the surface of the light-curing plastic material 6 such that each row of the chip of the UV-LED data projector 1 travels or can travel fully over any point to be illuminated.

The illuminated field thus generated on the surface of the light-curing plastic material 6 cures the liquid components such that a solid plastic body 10 arises. The solid plastic body 10 is supported as in a bearing on a bracketing 12, which is slowly being lowered such that the upper surface of the plastic body 10 is wetted by the liquid light-curing plastic material 6 and a new solid layer can be generated on the plastic body 10 by means of the illuminated field. For details regarding the implementation, reference shall be made to EP 1 880 830 A1 or EP 1 894 705 A2.

A homogenisation of the illuminated field and therefore of the plastic body 10 thus generated is attained in that the pixels arranged in the middle of the UV-LED data projector 1 are not used, i.e. in that they remain black. For clarity, a use according to the invention and/or a controlling e.g. triggering according to the invention of a chip of this type is shown in FIG. 2B and shall be explained in the following.

Figure 2A:
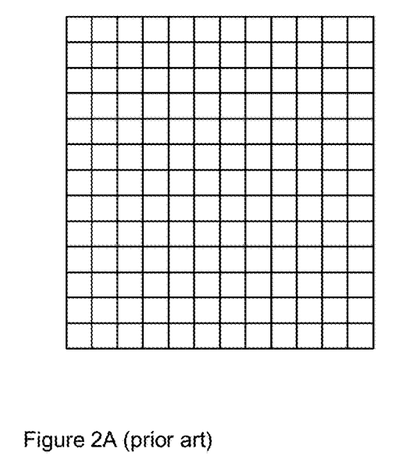
FIG. 2: shows a schematic comparison of a fully illuminated UV data projector chip according to the prior art (FIG. 2A) and a UV data projector chip operated according to the invention (FIG. 2B).
Figure 2B:
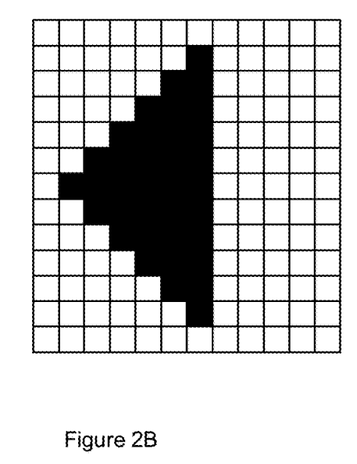

FIG. 2 shows a schematic comparison of a fully illuminated UV data projector chip according to the prior art (FIG. 2A) as compared to a UV data projector chip operated according to the invention (FIG. 2B). The UV-LED chip shown for exemplary purposes has only 12×13 pixels to allow the underlying principle of the present invention to be illustrated easily. In a real embodiment, UV-LED data projectors of significantly higher resolution are used, for example 1920×1080 pixels.

Each of the UV-LED chips has 12 columns and 13 rows. In the fully illuminated UV-LED chip according to the prior art (FIG. 2A), the inner areas of the illuminated field are irradiated with a higher UV intensity than the outer areas. As a result, the highest intensity is produced in the middle column and the intensity decreases towards the outside. Due to scattering effects and other phenomena related to the optical system, the individual pixels of the UV-LED data projector cannot be projected at any image sharpness. Accordingly, each pixel also illuminates the areas of the illuminated field that should be illuminated by its neighbouring pixels. As a result, areas of the illuminated field illuminated by the inner pixels receive a higher intensity than the areas of the illuminated field illuminated by the outer pixels.

This is compensated with respect to the columns (from top to bottom in FIG. 2) in that the UV-LED data projector is driven over the illuminated field along a direction of motion X. The direction of motion X of the UV-LED data projector and/or of the illuminated field is indicated by the arrow in FIGS. 2A and 2B. Accordingly, the image emitted by the UV-LED chips is being moved over the illuminated field in the direction of the rows (from left to right in FIG. 2, i.e. along the arrow X). A DLP® chip made by Texas Instruments can be used for projection.

The black pixels shown in FIG. 2B, which remain switched-off or are not reflected onto the surface of the liquid light-curing plastic material by the spatial light modulator, progressively reduce the light intensity towards the middle in the different columns of the UV-LED data projector operated according to the invention. As a result, the middle areas of the illuminated field swept along the direction of motion X receive the same intensity of ultraviolet radiation as the outer areas (rows).

The simplest version of a method according to the invention can be implemented by storing a mask for the data projector that defines which of the pixels are not switched-on and/or used and thus remain black. Alternatively, a spatial light modulator can be used just as well that comprises fewer or blackened mirrors in the middle.

In FIG. 2B, only the outermost two rows are irradiated by all twelve pixels, whereas one pixel less lights up and/or is projected for each row closer to the middle row. In the middle row, only six pixels are active and/or only six pixels are projected. Sweeping over the illuminated field along the direction of motion X, a mean illumination intensity is generated at the illuminated points of the illuminated field and the mean illumination intensity is directly proportional to the number of pixels of the UV-LED data projector that are used and/or projected. Suitable data projectors can have a resolution of up to 100,000 or up to 1.5 million pixels. Just as well, data projectors projecting in XGA and super-XGA (SXGA) resolutions of 1,280×1,024 pixels can be used.

In order to attain a uniformly homogenised distribution of light quantity on the surface of the light-curing plastic material and/or of the projection surface, the illuminated field is guided over an assembly platform at a constant velocity. Presently, the assembly platform is 1,920×20,000 pixels in size (pixel size presently is 50×50 µm). During the motion, image details are constantly reproduced via the illuminated field.

The previously defined mask stored in the UV data projector generates dead (permanently black) pixels in the individual rows. In this case, the number of pixels in the rows defined to be black increases towards the middle, since the rows in the middle are illuminated more brightly for constructive reasons (due to the optical system).

The effect is as follows: Due to the motion of the UV data projector, the entire row of the illuminated field is controlled, e.g. triggered during an illumination. As a result, a maximal amount of UV light of 1080 is generated during the sweep. If fewer pixels are controlled, e.g. addressed, the power is reduced and the uneven illumination of the optical system can be balanced.

Figure 3A:
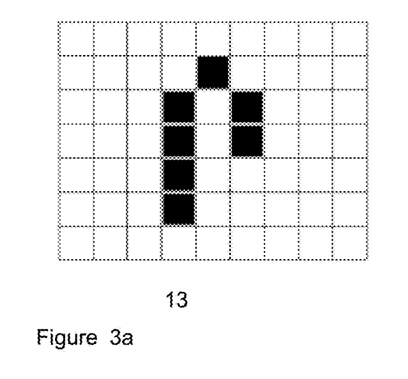
FIG. 3a: shows a motif to be printed (13), whereby the light points are shown as black pixels.
Figure 3B:
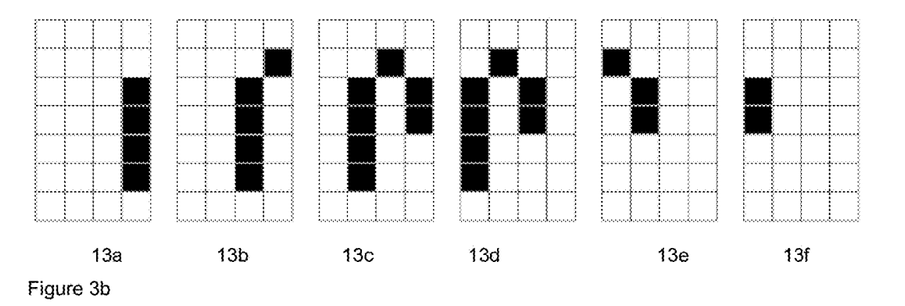
FIG. 3b: shows the images that are projected individually by the light source (1) of the data projector (extracted single images of motif 13a, 13 b, 13c, 13d, 13e, 13f) for generation of the motif to be printed (13) during the motion of the light source over the projection surface (with no mask), whereby the light points are shown as black pixels.
Figure 3C:
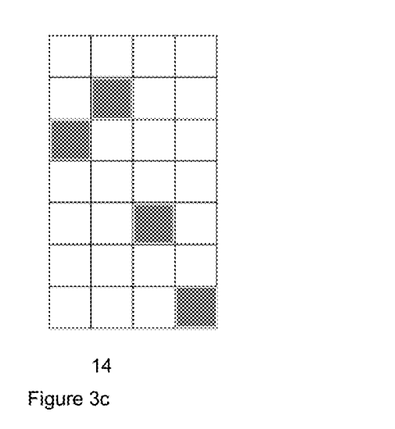
FIG. 3c: shows a motif of the switched-off light points (14) generated by means of a mask or of switched-off light points generated by the spatial light modulator for compensation of illumination differences, whereby the switched-off light points are shown as grey pixels.

FIG. 3a shows a motif to be printed 13, in which the light points are shown as black pixels. FIG. 3b shows the sequence of images that are projected individually by the light source (extracted single images of the motif 13a, 13b, 13c, 13d, 13e, 13f) for generation of the motif to be printed 13 during the motion of the light source or of the arrangement over the projection surface (without motif of the switched-off light points and/or with no mask). The light points are shown as black pixels. FIG. 3c shows the motif of the switched-off light points 14. The motif of the switched-off light points is generated by the spatial light modulator and/or the mask. The switched-off light points are shown as grey pixels. In this manner, light points can be switched-off or deflected by the spatial light modulator in order to balance out differences in illumination.

Figure 3D:
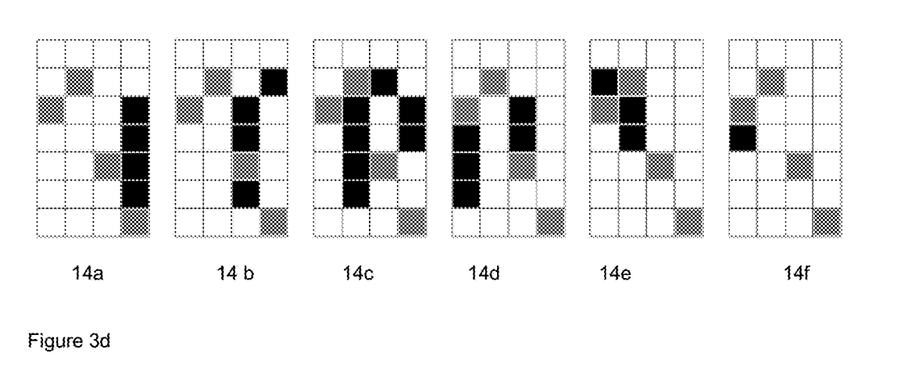
FIG. 3d: shows an addition and/or superimposition of the motif of the switched-off light points (14) generated by the spatial light modulator and/or the mask and the extracted single images of the motif (13a to 13f), whereby the mask with the switched-off light points (14) is shown as grey pixels and the light points are shown as black pixels. The motif of the switched-off light points (14, negative motif) shown as grey pixels is subtracted statically in all single images of the motif as superimposition and/or subtraction, i.e. of the motif of the permanently faded-out or switched-off light points (14) from the single images of the motif (13a to 13f) of the motif to be printed (13) and shown as superimposition in the single images of the motif to be illuminated (14a, 14b, 14c, 14d, 14e, 14f).
Figure 4:
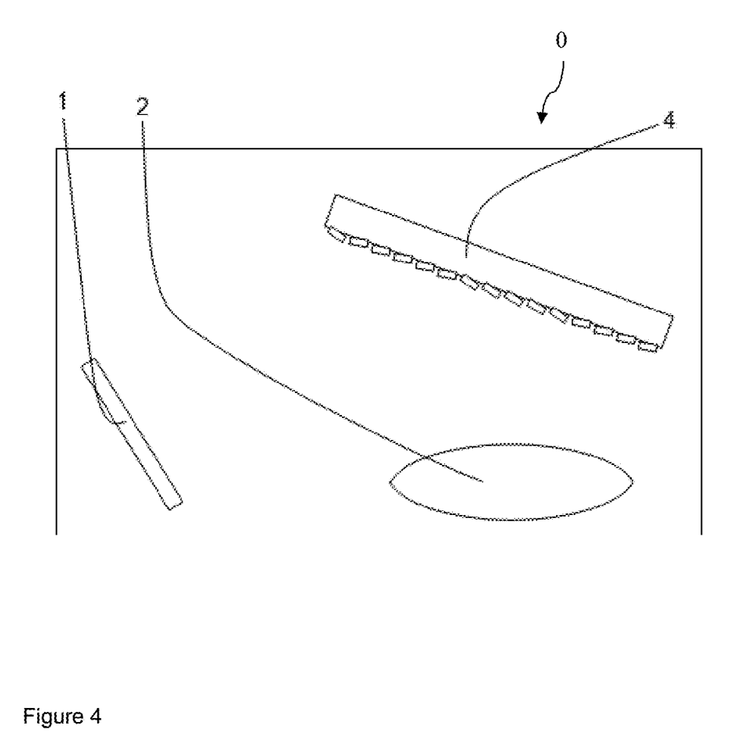
FIG. 4: shows a cross-sectional view of another set-up for implementation of a method according to the invention.

FIG. 3d shows the superimposition of the motif of the switched-off light points 14, in particular of the static motif, generated by the spatial light modulator and/or the mask and the extracted single images of the motif 13a to 13f. The motif of the switched-off light points 14 or the mask are shown as grey pixels. The illuminated pixels in the illuminated field are shown as black pixels and form the single images of the motif to be illuminated (14a, 14b, 14c, 14d, 14e, 14f).

The features of the invention disclosed in the preceding description and in the claims, figures, and exemplary embodiments, can be essential for the implementation of the various embodiments of the invention both alone and in any combination.

LIST OF REFERENCE NUMBERS

0 Assembly comprising light source (1), such as a UV-LED data projector (1) or laser system, optical system, in particular lens system (2), spatial light modulator (4),
1 UV-LED data projector
2 Lens system
3 Arrangement of the spatial light source (1), spatial light modulator (4) and/or lens system/optical system (2)
4 Spatial light modulator
5 Illuminated field
6 Light-curing liquid plastic material
8 Receptacle
10 Cured light-curing plastic material/plastic body
12 Bracketing
13 Motif to be printed,
13a to 13f Images projected individually (13a, 13b, 13c, 13d, 13e, 13f) to generate the motif to be printed
14 Motif of the switched-off light points/motif of non-illuminated pixels
14a to 14f single images of the motif to be illuminated, with a homogenised distribution of light intensity. Images projected individually (14a, 14b, 14c, 14d, 14e, 14f) to generate the motif to be printed 13, shown as individually projected images (13a, 13b, 13c, 13d, 13e, 13f) for generating the motif to be printed during scrolling with a static superimposition of the motif of the switched-off light points (14)

The invention claimed is:

1. Method for producing a homogenised distribution of light quantity with a spatial light modulator that comprises a multitude of controllable and tiltable micro-mirrors that are arranged in rows and columns, said method comprising projecting the light of a spatially emitting light source by means of an optical system, wherein the spatially emitting light source is a data projector, and guiding an illuminated field of the projected light source over a projection surface, whereby, towards the middle of the illuminated field, an increasing number of pixels is not being illuminated such that a homogenisation of the light intensity of all pixels that are illuminated on the projection surface is attained in the time integral, and wherein a mask stored for controlling the data projector defines the non-illuminated pixels in that certain light points of the data projector remain switched off at all times.

2. Method according to claim 1, wherein the data projector is a UV-LED data projector.

3. Method according to claim 1, wherein
a programmable mask stored for controlling the data projector defines the non-illuminated pixels in that certain light points of the data projector remain switched off at all times.

4. Method according to claim 1, wherein
the number of non-illuminated pixels increases towards the middle of the illuminated field according to a function or according to a parabola.

5. Method according to claim 4, wherein
the function is determined depending on the inhomogeneity of the illuminated field caused by the optical system.

6. Method according to claim 1, wherein
the spatially emitting light source, the spatial light modulator, and the optical system form an arrangement and/or the spatially emitting light source, the spatial light modulator, and the optical system are present in an assembly as an arrangement.

7. Method according to claim 1, wherein
the function is determined depending on the inhomogeneity of the illuminated field caused by the spatial light source, the arrangement comprising the spatial light source, the spatial light modulator and/or the optical system.

8. Method according to claim 1, wherein
the intensity distribution of the illuminated field is measured or calculated at maximal illumination by the light source and the spatial light modulator, the light source of the arrangement or the light source of the assembly and the number of non-illuminated pixels in each row and/or column is calculated therefrom.

9. Method according to claim 1, wherein the illuminated field is periodically guided over the projection surface, whereby it is optional to use the surface of a liquid light-curing plastic material as projection surface.

10. Method according to claim 1, wherein the arrangement comprising the spatially emitting light source, the assembly comprising a spatially emitting light source or the spatially emitting light source is guided over the projection surface in order to guide the illuminated field of the projected light source over the projection surface.

11. Method according to claim 1, wherein a data projector or a laser system with radiation of a wavelength between 180 to 400 nm is used as spatially emitting light source.

12. Method according to claim 1, wherein single images of the motif illuminated in the illuminated field are generated through a superimposition a) of extracted single images of the motif the motif of the switched-off light points.

13. Rapid prototyping method, said method comprising illuminating a liquid light-curing plastic material using a method according to claim 1, projecting the illuminated field onto the surface of the plastic material and curing the plastic material by the illumination in the illuminated field.

* * * * *